US012772409B2

(12) United States Patent
Sanville et al.

(10) Patent No.: US 12,772,409 B2
(45) Date of Patent: Oct. 20, 2026

(54) SERVER INFORMATION HANDLING SYSTEM POWER SUPPLY UNIT INSTALLATION SYSTEM

(71) Applicant: Dell Products L.P., Round Rock, TX (US)

(72) Inventors: Alex Sanville, Upton, MA (US); Jason Pritchard, Hopkinton, MA (US)

(73) Assignee: Dell Products L.P., Round Rock, TX (US)

( * ) Notice: Subject to any disclaimer, the term of this patent is extended or adjusted under 35 U.S.C. 154(b) by 116 days.

(21) Appl. No.: 19/008,391

(22) Filed: Jan. 2, 2025

(65) Prior Publication Data

US 2026/0190274 A1 Jul. 2, 2026

(51) Int. Cl.
*H05K 7/14* (2006.01)

(52) U.S. Cl.
CPC .................................. *H05K 7/1492* (2013.01)

(58) Field of Classification Search
CPC .. H05K 7/1487; H05K 7/1492; H05K 7/1489; H05K 7/1076; H05K 7/1402; H05K 7/1405; H05K 7/1408; H05K 7/1411; H05K 7/1417; H05K 7/1418; H05K 7/14322; H05K 7/14324; H05K 7/1457; H05K 7/1461; H05K 7/1471; H05K 7/1488; H05K 7/16; G06F 1/187; G06F 1/181; G06F 1/184; G06F 1/185; G06F 1/188; G06F 1/1658; G06F 1/18; G06F 1/183
See application file for complete search history.

(56) References Cited

U.S. PATENT DOCUMENTS

| | | | | |
|---|---|---|---|---|
| 4,947,661 | A * | 8/1990 | Yoshida | B60K 37/00 292/226 |
| 5,332,306 | A * | 7/1994 | Babb | H05K 7/1418 439/377 |
| 7,400,936 | B2 * | 7/2008 | Chang | G06F 1/184 |
| 9,352,700 | B2 * | 5/2016 | Prin | B60K 35/50 |
| 9,910,467 | B2 * | 3/2018 | Barron | G06F 1/188 |
| 10,563,429 | B1 * | 2/2020 | Bailey | E05B 35/008 |
| 12,507,369 | B2 * | 12/2025 | Utz | G06F 1/181 |
| 2019/0132967 | A1 * | 5/2019 | Lu | H05K 5/0204 |
| 2022/0210943 | A1 * | 6/2022 | Chang | H05K 7/1492 |
| 2022/0350935 | A1 * | 11/2022 | Strickland | G06F 30/17 |
| 2023/0301013 | A1 * | 9/2023 | Mao | H05K 5/0208 361/601 |

* cited by examiner

*Primary Examiner* — Abhishek M Rathod
(74) *Attorney, Agent, or Firm* — Terrile, Cannatti & Chambers, LLP; Stephen A. Terrile

(57) ABSTRACT

A power system for an information handling system. The system includes a plurality of power supplies, a power distribution system coupled to the plurality of power supply units and a power supply unit installation system. The power supply unit installation system includes a plurality of power supply unit bays; and a power supply unit bay lock-out mechanism, the power supply unit bay lock-out mechanism enforcing power supply unit population requirements associated with the information handling system.

15 Claims, 5 Drawing Sheets

SERVER INFORMATION HANDLING SYSTEM POWER SUPPLY UNIT INSTALLATION SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a server type information handling system with a power system having a power supply unit installation system.

In one embodiment, the invention relates to a power supply unit installation system of a power system for use with an information handling system, comprising: a plurality of power supply unit bays; and a power supply unit bay lock-out mechanism, the power supply unit bay lock-out mechanism enforcing power supply unit population requirements associated the information handling system.

In another embodiment, the invention relates to a power system for an information handling system comprising a plurality of power supply units; a power distribution system coupled to the plurality of power supply units; and a power supply unit installation system, the power supply unit installation system comprising: a plurality of power supply unit bays; and a power supply unit bay lock-out mechanism, the power supply unit bay lock-out mechanism enforcing power supply unit population requirements associated the information handling system.

In another embodiment, the invention relates to a system comprising: a chassis; a plurality of components contained within the chassis; and, the power system including a power supply unit, a power distribution system coupled to the power supply unit and a power supply unit installation system, the power supply unit installation system comprising: a plurality of power supply unit bays; and a power supply unit bay lock-out mechanism, the power supply unit bay lock-out mechanism enforcing power supply unit population requirements associated the information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
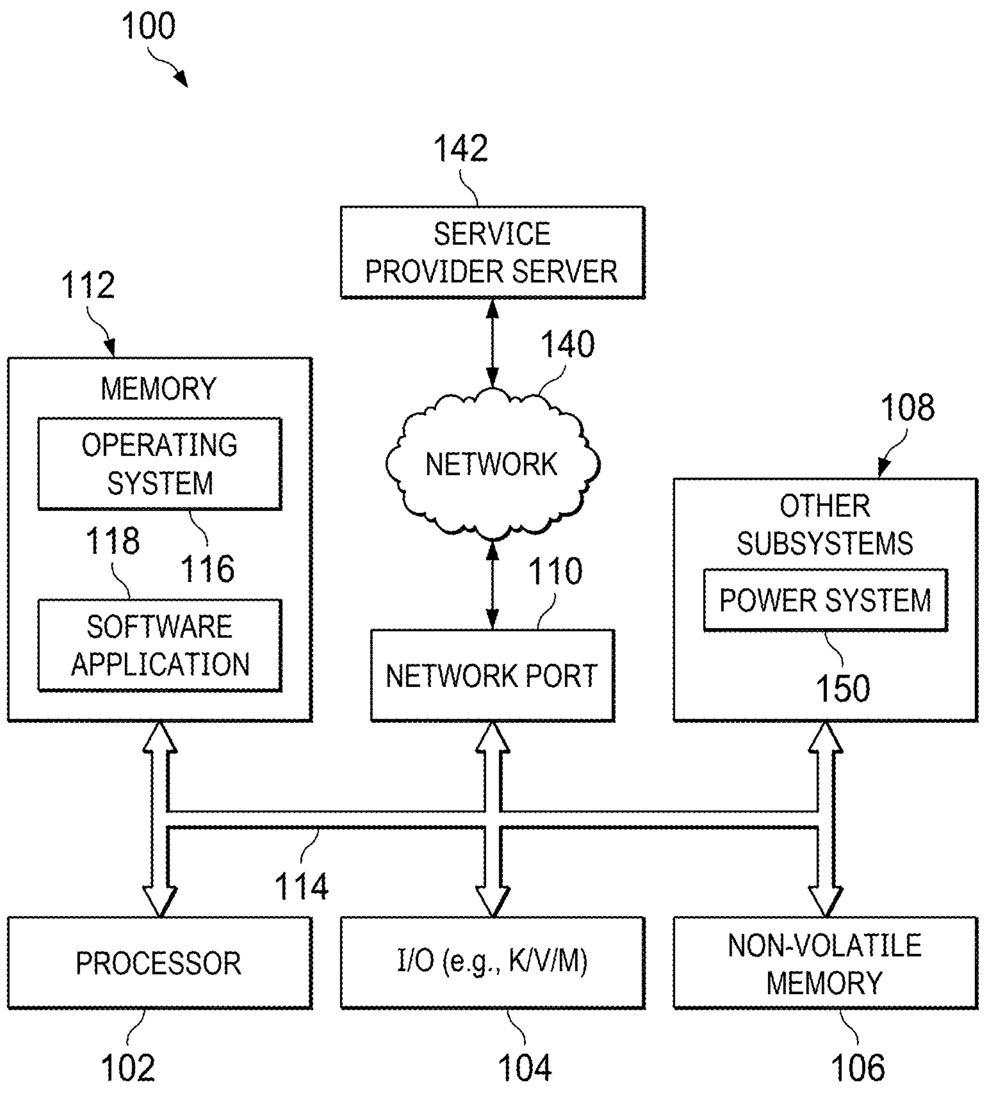
FIG. 1 shows a general illustration of components of an information handling system as implemented in the system and method of the present invention.

Various aspects of the present disclosure include an appreciation that server type information handling system designs are becoming increasingly challenging as a function of growing component size, increasing power requirements and increasing heat loads within the system. Various aspects of the present disclosure include an appreciation that it is known to provide information handling systems with a plurality of components. Various aspects of the present disclosure include an appreciation that graphics processing unit (GPU) modules (often referred to as accelerator add in cards (AICs) and drive modules are examples of components that are often included within an information handling system. Various aspects of the present disclosure include an appreciation that it may be desirable to provide an information handling system with an array of components. Various aspects of the present disclosure include an appreciation that it may be desirable to install an array of GPU modules within an information handling system.

Various aspects of the present disclosure include an appreciation that GPU modules are often configured to conform to form factor standards. Various aspects of the present disclosure include an appreciation that the card electromechanical (CEM) form factor standard is one such form factor standard. Various aspects of the disclosure include an appreciation that it is known to provide information handling systems with baseboard systems such as peripheral component interconnect express (PCIe) type baseboard systems.

Various aspects of the present disclosure include an appreciation that powering components within server type information handling system often require high capacity power distribution designs. Various aspects of the present disclosure include an appreciation that high capacity power distribution can be an especially challenging aspect of server type information handling system design. Various aspects of the present disclosure include an appreciation that these issues are especially present in systems which are designed with a plurality of components such as a plurality of GPUs or a plurality of drives. These issues are also especially present in systems which are designed with an array of AICs, such as in systems which are designed to support artificial intelligence (AI) workloads.

Various aspects of the present disclosure include an appreciation that server type information handling system designs can often include a plurality of high capacity power supplies to provide redundant power to a plurality of components within the server type information handling system such as GPU modules as well as other high powered components. With one such design six, 3200 Watt power supplies are included within the information handling system to provide high and redundant power to a plurality of components. Distributing the power from these power supplies can present design challenges. For example, components of the power distribution are often physically located between the power supplies and the plurality of components resulting in the power distribution system being part of the depth of the critical stack within the information handling system chassis. Various aspects of the present disclosure include an appreciation that the depth of the power distribution system has implications for rack support (due for example, to product depth), cost (due for example to the size of components of the power distribution system), or a combination thereof.

Various aspects of the present disclosure include an appreciation that certain power distribution solutions include power distribution structures which include multiple connectors. Various aspects of the present disclosure include an appreciation that certain multiple connector configurations can require higher withdrawal force to disengage the connectors. Various aspects of the present disclosure include an appreciation that certain power distribution solutions include power distribution structures can be large and heavy. Various aspects of the present disclosure include an appreciation that certain power distribution solutions include power distribution structures often do not provide a good handling point to overcome the higher withdraw force between the connectors and the power distribution structures. Various aspects of the present disclosure include an appreciation that certain power distribution solutions include power distribution structures often do not provide a good handling point physically manipulate the large and heavy power distribution structures.

Various aspects of the present disclosure include an appreciation that it would be desirable to provide a power distribution solution with a power distribution system extraction mechanism which can address these issues.

Various aspects of the present disclosure include an appreciation that configuring power distribution solutions for AI system designs often include sets of power supply units. Various aspects of the present disclosure include an appreciation that some known AI system designs can include up to eight high powered power supply units (e.g., eight 3 KW power supply units), where two power supply units are coupled to power a processor zone and six power supply units are coupled to power a component array zone. Various aspects of the present disclosure include an appreciation that designing a single power plane fed by six power supply units while also limiting chassis depth can present a number of current balancing and delivery challenges.

Various aspects of the present disclosure include an appreciation that with certain power system designs, if the system is full of lower-powered components (e.g., less than 75 W components), all power to the components can be delivered via power supply units coupled to a baseboard such as via PCIe connectors on the baseboard. Various aspects of the present disclosure include an appreciation that with certain power system designs, a majority of component power can be supplied via auxiliary power connectors cabled directly to components from a power distribution system. If the power supply units are coupled to the baseboard, as compared to being coupled to the power distribution system, then no current travels through the power distribution system connectors.

However, if the power supply units are only coupled to the power distribution system, and not to the baseboard, then the current flowing through the power distribution system connectors can exceed the capacity of the power distribution system connectors. Such a power supply unit configuration can present itself in somewhat unique situations, such as system manufacturing or testing situations.

Accordingly, various aspects of the present disclosure include an appreciation that it would be desirable to provide a power supply unit installation system which can prevent incorrect power supply unit installations. Accordingly, various aspects of the present disclosure include an appreciation that it would be desirable to provide a power supply unit installation system which can prevent incorrect power supply unit installations associated with component power distribution system designs.

A system and method are disclosed for providing a server type information handling system with power system which includes a power distribution system, a power distribution system extraction mechanism, a power supply unit installation system, or a combination thereof. In certain embodiments, the power distribution system includes an auxiliary power board, power distribution bars mounted on the auxiliary power board, vertical power distribution bar components, or a combination thereof. In certain embodiments, the power distribution system extraction mechanism includes a horizontal extraction portion, vertical extraction portions, one or more extraction manipulation components, or a combination thereof. In certain embodiments, the power supply unit installation system enforces power supply unit population requirements associated with a component region of an information handling system.

In certain embodiments, the power distribution system includes power distribution bars mounted on the auxiliary power board. In certain embodiments, the power distribution bars extend horizontally across the auxiliary power board. In certain embodiments, the power distribution system includes vertical power distribution bar components. In certain embodiments, the positive and ground vertical power distribution bar components are interlaced such that the positive vertical power distribution bar component is electrically coupled to the positive power distribution bar and the ground vertical power distribution bar component is electrically coupled to the ground power distribution bar.

In certain embodiments, the power distribution system extraction mechanism includes a horizontal extraction portion and the vertical extraction portions provide a power distribution system support brace. In certain embodiments, the extraction manipulation components are coupled to the vertical extraction portions. In certain embodiments, the extraction manipulation components can be positioned in a power distribution system installed configuration, a power distribution removal configuration, or a combination thereof. In certain embodiments, the extraction manipulation components can be manipulated from the power distribution system installed configuration to the power distribution system removal configuration to disengage connectors of the power distribution system. In certain embodiments, each extraction manipulation component includes a camming component. In certain embodiments, the camming component is rotated to manipulate the power distribution extraction mechanism from the power distribution system installed configuration to the power distribution system removal configuration. In certain embodiments, by so rotating the camming component an upward force is applied to an underside of the power distribution system. In certain embodiments, the upward force is applied to an underside of the auxiliary power board of the power distribution system, a power distribution bar of the power distribution system, or a combination thereof. In certain embodiments, the force applied is sufficient to disengage to connector from the connector socket.

Such a power distribution system advantageously provides a reduced footprint power distribution solution for high power accelerator server type information handling systems. Such a power distribution system advantageously provides a power distribution solution with a power distribution system extraction mechanism which includes a handling point that can overcome the higher withdraw force between the connectors and the power distribution structures. Such a power distribution system advantageously provides a power distribution solution with a power distribution system extraction mechanism which includes a handling point that facilitates physical manipulation of power distribution structures.

In certain embodiments, the power supply unit installation system enforces bottom to top power supply unit population requirements associated with a component region of an information handling system. In certain embodiments, the power supply unit installation system includes a power supply unit bay lock-out mechanism. In certain embodiments, the power supply unit bay lock-out mechanism includes a mechanical lock-out feature. In certain embodiments, the power supply unit bay lock-out mechanism enforces a bottom to top power supply unit population requirement associated with a component region of an information handling system. In certain embodiments, the power supply unit bay lock-out mechanism blocks one or more upper power supply unit bays until a power supply unit is installed in a bottom power supply unit bay. In certain embodiments, the power supply unit bay lock-out mechanism is controlled by gravity, is spring-loaded, or a combination thereof. In certain embodiments, the bottom power supply unit bay is associated with a baseboard power supply unit connection. In certain embodiments, the one or more upper power supply unit bays are associated with respective power distribution system power supply unit connections.

In certain embodiments, the power supply unit installation system includes a first side power supply unit bay lock-out mechanism, a second side power supply unit lock-out mechanism, or a combination thereof. In certain embodiments, the first side power supply unit bay lock-out mechanism and second side power supply unit lock-out mechanism are configured to interoperate such that the first side power supply unit bay lock-out mechanism and the second side power supply unit bay lock-out mechanism enforce a bottom to top power supply unit population requirement associated with both the first side power supply unit population and second side power supply unit population.

Such a power supply unit installation system advantageously prevents incorrect power supply unit installations. In certain embodiments, such a power supply unit installation system advantageously prevents incorrect power supply unit installations associated with component power distribution system designs.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both of the other subsystems 108 or the network port 110 include a power system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the power system 150 is part of a power environment which includes a power system and a plurality of components coupled to the power system. In certain embodiments, the plurality of components are arranged as an array of components. In certain embodiments, the plurality of components includes a plurality of GPUs, a plurality of drives, or a combination thereof. In certain embodiments, the plurality of GPUs, the plurality of drives, or a combination thereof, are designed to support artificial intelligence (AI) workloads.

In certain embodiments, the power system 150 includes one or more power supplies as well as a power distribution system. In certain embodiments, the power system 150 includes a power distribution system, a power distribution system extraction mechanism, a power supply unit installation system, or a combination thereof. In certain embodiments, the power distribution system includes an auxiliary power board, power distribution bars mounted on the auxiliary power board, vertical power distribution bar components, or a combination thereof. In certain embodiments, the power distribution system extraction mechanism includes a horizontal extraction portion, vertical extraction portions, one or more extraction manipulation components, or a combination thereof. In certain embodiments, the power supply unit installation system enforces power supply unit population requirements associated with a component region of an information handling system.

In certain embodiments, the power distribution system includes power distribution bars mounted on the auxiliary power board. In certain embodiments, the power distribution bars extend horizontally across the auxiliary power board. In certain embodiments, the power distribution system includes vertical power distribution bar components. In certain embodiments, the positive and ground vertical power distribution bar components are interlaced such that the positive vertical power distribution bar component is electrically coupled to the positive power distribution bar and the ground vertical power distribution bar component is electrically coupled to the ground power distribution bar.

In certain embodiments, the power distribution system extraction mechanism includes a horizontal extraction portion and the vertical extraction portions provide a power distribution system support brace. In certain embodiments, the extraction manipulation components are coupled to the vertical extraction portions. In certain embodiments, the extraction manipulation components can be positioned in a power distribution system installed configuration, a power distribution removal configuration, or a combination thereof. In certain embodiments, the extraction manipulation components can be manipulated from the power distribution system installed configuration to the power distribution system removal configuration to disengage connectors of the power distribution system. In certain embodiments, each extraction manipulation component includes a camming component. In certain embodiments, the camming component is rotated to manipulate the power distribution extraction mechanism from the power distribution system installed configuration to the power distribution system removal configuration. In certain embodiments, by so rotating the camming component an upward force is applied to an underside of the power distribution system. In certain embodiments, the upward force is applied to an underside of the auxiliary power board of the power distribution system, a power distribution bar of the power distribution system, or a combination thereof. In certain embodiments, the force applied is sufficient to disengage to connector from the connector socket.

Such a power distribution system advantageously provides a reduced footprint power distribution solution for high power accelerator server type information handling systems. Such a power distribution system advantageously provides a power distribution solution with a power distribution system extraction mechanism which includes a handling point that can overcome the higher withdraw force between the connectors and the power distribution structures. Such a power distribution system advantageously provides a power distribution solution with a power distribution system extraction mechanism which includes a handling point that facilitates physical manipulation of power distribution structures.

In certain embodiments, the power supply unit installation system enforces bottom to top power supply unit population requirements associated with a component region of an information handling system. In certain embodiments, the power supply unit installation system includes a power supply unit bay lock-out mechanism. In certain embodiments, the power supply unit bay lock-out mechanism includes a mechanical lock-out feature. In certain embodiments, the power supply unit bay lock-out mechanism enforces a bottom to top power supply unit population requirement associated with a component region of an information handling system. In certain embodiments, the power supply unit bay lock-out mechanism blocks one or more upper power supply unit bays until a power supply unit is installed in a bottom power supply unit bay. In certain embodiments, the power supply unit bay lock-out mechanism is controlled by gravity, is spring-loaded, or a combination thereof. In certain embodiments, the bottom power supply unit bay is associated with a baseboard power supply unit connection. In certain embodiments, the one or more upper power supply unit bays are associated with respective power distribution system power supply unit connections.

In certain embodiments, the power supply unit installation system includes a first side power supply unit bay lock-out mechanism, a second side power supply unit lock-out mechanism, or a combination thereof. In certain embodiments, the first side power supply unit bay lock-out mechanism and second side power supply unit lock-out mechanism are configured to interoperate such that the first side power supply unit bay lock-out mechanism and the second side power supply unit bay lock-out mechanism enforce a bottom to top power supply unit population requirement associated with both the first side power supply unit population and second side power supply unit population.

Such a power supply unit installation system advantageously prevents incorrect power supply unit installations. In certain embodiments, such a power supply unit installation system advantageously prevents incorrect power supply unit installations associated with component power distribution system designs.

Figure 2:
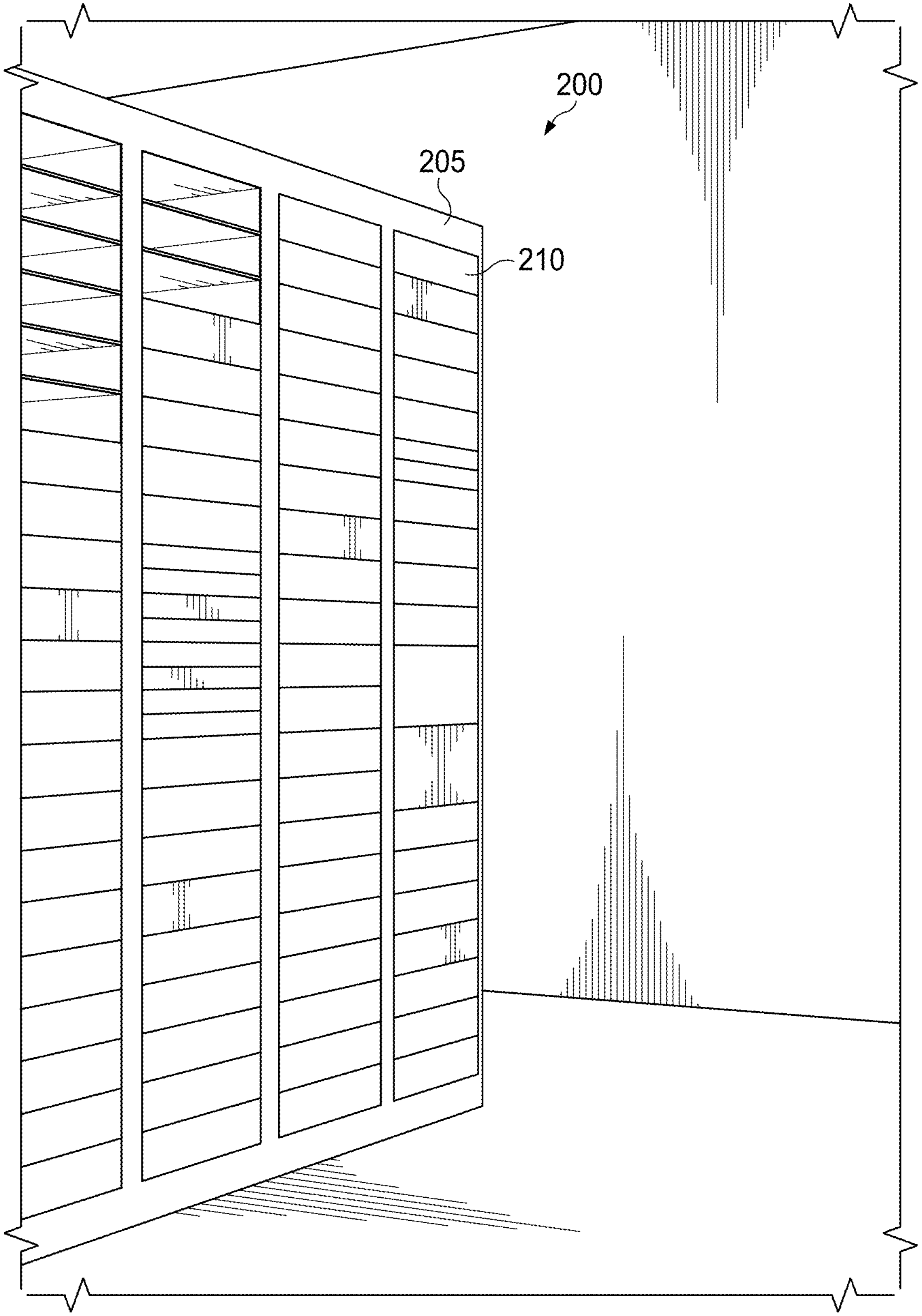
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100, as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit, and a 4 U rack unit. In general, a 1 U rack unit is substantially (i.e., +/−20%) 1.75" high, a 2 U rack unit is substantially (i.e., +/−20%) 3.5" high, and a 4 U rack height is substantially (i.e., +/−20%) 7.0" high.

Figure 3:
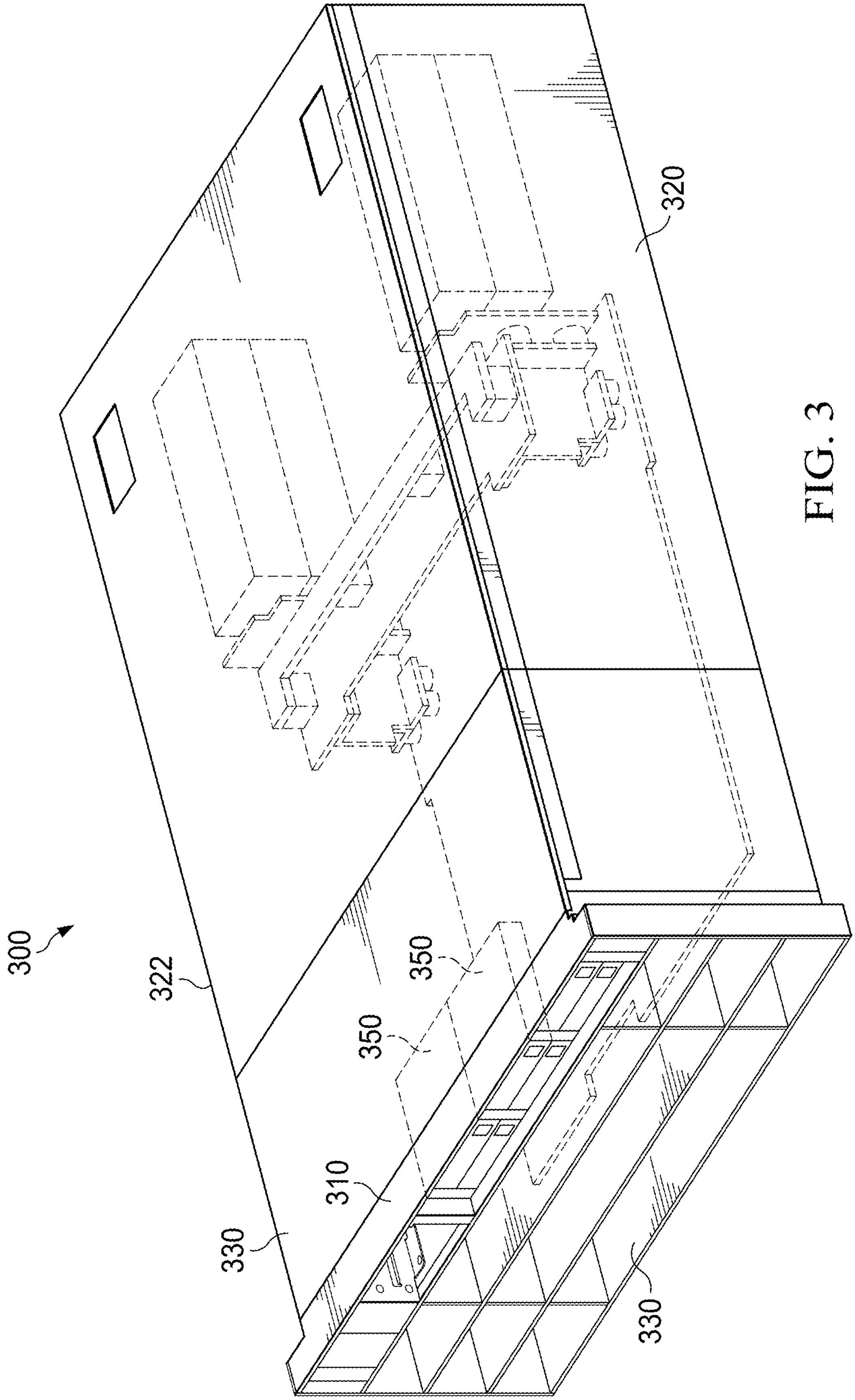
FIG. 3 shows a generalized perspective view of an example server type information handling system.

FIG. 3 shows a generalized perspective view of an example blade server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300. In certain embodiments, the server system 300 includes one or more device bays 350, 360. In certain embodiments, the server system 300 includes a power environment 360. In certain embodiments, the power environment 360 corresponds to power system 150.

In certain embodiments, the power environment 360 is part of a power environment which includes a power system and a plurality of components coupled to the power system. In certain embodiments, the plurality of components are arranged as an array of components. In certain embodiments, the plurality of components includes a plurality of GPUs, a plurality of drives, or a combination thereof. In certain embodiments, the plurality of GPUs, the plurality of drives, or a combination thereof, are designed to support artificial intelligence (AI) workloads.

In certain embodiments, the power environment 360 includes one or more power supplies as well as a power distribution system. In certain embodiments, the power system includes a power distribution system, a power distribution system extraction mechanism, a power supply unit installation system, or a combination thereof. In certain embodiments, the power distribution system includes an auxiliary power board, power distribution bars mounted on the auxiliary power board, vertical power distribution bar components, or a combination thereof. In certain embodiments, the power distribution system extraction mechanism includes a horizontal extraction portion, vertical extraction portions, one or more extraction manipulation components, or a combination thereof. In certain embodiments, the power supply unit installation system enforces power supply unit population requirements associated with a component region of an information handling system. As used herein, a component region of an information handling system broadly refers to an area of the information handling system in which a plurality of components are installed alone with one or more support functions associated with the plurality of components. In certain embodiments, the one or more support functions include a component system board, a power distribution system, power supply units for powering the plurality of components, etc. In certain embodiments, the plurality of components of the component region are arranged as an array of components. In certain embodiments, the plurality of components of the component region include a plurality of GPU modules. In certain embodiments, the plurality of GPU modules are designed to support artificial intelligence (AI) workloads.

In certain embodiments, the power distribution system includes power distribution bars mounted on the auxiliary power board. In certain embodiments, the power distribution bars extend horizontally across the auxiliary power board. In certain embodiments, the power distribution system includes vertical power distribution bar components. In certain embodiments, the positive and ground vertical power distribution bar components are interlaced such that the positive vertical power distribution bar component is electrically coupled to the positive power distribution bar and the ground vertical power distribution bar component is electrically coupled to the ground power distribution bar.

In certain embodiments, the power distribution system extraction mechanism includes a horizontal extraction portion and the vertical extraction portions provide a power distribution system support brace. In certain embodiments, the extraction manipulation components are coupled to the vertical extraction portions. In certain embodiments, the extraction manipulation components can be positioned in a power distribution system installed configuration, a power distribution removal configuration, or a combination thereof. In certain embodiments, the extraction manipulation components can be manipulated from the power distribution system installed configuration to the power distribution system removal configuration to disengage connectors of the power distribution system. In certain embodiments, each extraction manipulation component includes a camming component. In certain embodiments, the camming component is rotated to manipulate the power distribution extraction mechanism from the power distribution system installed configuration to the power distribution system removal configuration. In certain embodiments, by so rotating the camming component an upward force is applied to an underside of the power distribution system. In certain embodiments, the upward force is applied to an underside of the auxiliary power board of the power distribution system, a power distribution bar of the power distribution system, or a combination thereof. In certain embodiments, the force applied is sufficient to disengage the connector from the connector socket.

In certain embodiments, the power supply unit installation system enforces bottom to top power supply unit population requirements associated with a component region of an information handling system. In certain embodiments, the power supply unit installation system includes a power supply unit bay lock-out mechanism. In certain embodiments, the power supply unit bay lock-out mechanism includes a mechanical lock-out feature. In certain embodiments, the power supply unit bay lock-out mechanism enforces a bottom to top power supply unit population requirement associated with a component region of an information handling system. In certain embodiments, the power supply unit bay lock-out mechanism blocks one or more upper power supply unit bays until a power supply unit is installed in a bottom power supply unit bay. In certain embodiments, the power supply unit bay lock-out mechanism is controlled by gravity, is spring-loaded, or a combination thereof. In certain embodiments, the bottom power supply unit bay is associated with a baseboard power supply unit connection. In certain embodiments, the one or more upper power supply unit bays are associated with respective power distribution system power supply unit connections.

In certain embodiments, the power supply unit installation system includes a first side power supply unit bay lock-out mechanism, a second side power supply unit lock-out mechanism, or a combination thereof. In certain embodiments, the first side power supply unit bay lock-out mechanism and second side power supply unit lock-out mechanism are configured to interoperate such that the first side power supply unit bay lock-out mechanism and the second side power supply unit bay lock-out mechanism enforce a bottom to top power supply unit population requirement associated with both the first side power supply unit population and second side power supply unit population.

Figure 4:
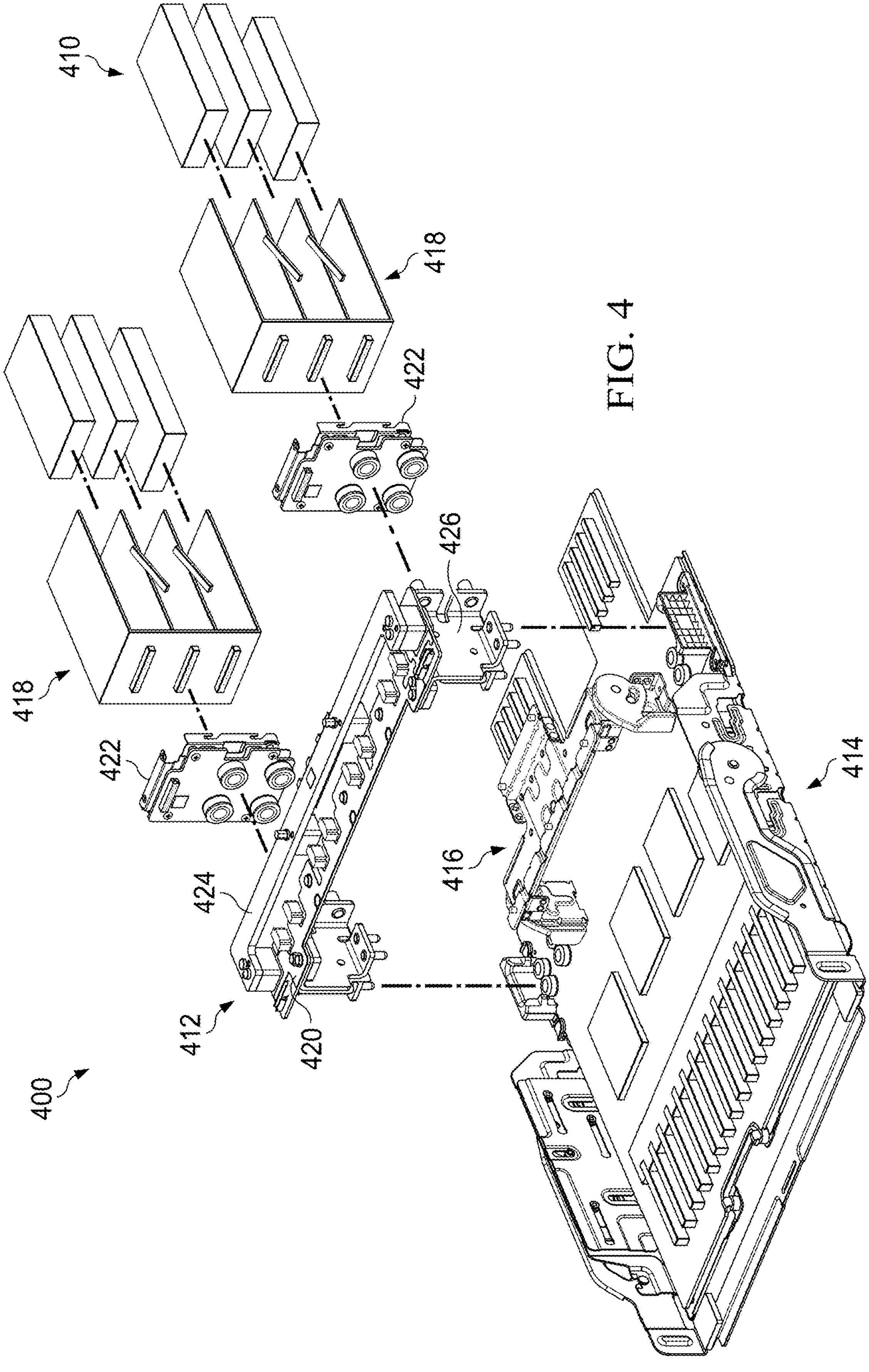
FIG. 4 shows an exploded perspective view of a power system.

FIG. 4 shows an exploded perspective view of a power system 400. In certain embodiments, the power system 400 corresponds to power system 150.

In certain embodiments, the power system 400 includes one or more power supplies 410 a power distribution system 412, a system circuit board 414, a power distribution system extraction mechanism 416, a power supply unit installation system 418, or a combination thereof. In certain embodiments, the system circuit board 414 includes one or more of a motherboard, a planar circuit board, a high performance module circuit board, and a baseboard circuit board. In certain embodiments, the power distribution system 412 includes an auxiliary power board 420, one or more power supply boards 422, power distribution bars 424, vertical power distribution bar device 426, or a combination thereof. In certain embodiments, the power distribution bars 424 are mounted on opposing sides of the auxiliary power board 420.

In certain embodiments, vertical power distribution bar components are configured as interlaced vertical power distribution bar components. As used herein, interlaced vertical power distribution components broadly refers to vertical power distribution components which are interspersed by alternation (i.e., positioned at alternating intervals) such that sets of vertical power distribution components occupy substantially (i.e. +/−20%) the same volume of space within the chassis of the information handling system.

In certain embodiments, the power distribution bars 424 include a positive power distribution bar, a ground power distribution bar, or a combination thereof. In certain embodiments, the positive power distribution bar and the ground power distribution bar are mounted on opposing sides of the auxiliary power board 420. In certain embodiments, the positive power distribution bar 420 extends horizontally across one side of the auxiliary power board. In certain embodiments, the ground power distribution bar extends horizontally across another side of the auxiliary power board 420. In certain embodiments, the positive power distribution bar extends horizontally across a top side of the auxiliary power board 420. In certain embodiments, the ground power distribution bar extends horizontally across a bottom side of the auxiliary power board 420.

In certain embodiments, each interlaced vertical power distribution bar component includes a positive vertical power distribution bar component, a ground vertical power distribution bar component, or a combination thereof. In certain embodiments, the positive vertical power distribution bar component and the ground vertical power distribution bar component are configured as interlaced positive and ground vertical power distribution bar components. In certain embodiments, the positive and ground vertical power distribution bar components are interlaced such that the positive vertical power distribution bar component is electrically coupled to the positive power distribution bar and the ground vertical power distribution bar component is electrically coupled to the ground power distribution bar. In certain embodiments, each interlaced vertical power distribution bar component 426 is physically coupled, electrically coupled, or a combination thereof, to one or more power supplies 410, the system circuit board 414, the auxiliary power board 420, a power supply board 422, the power distribution bars 424, or a combination thereof.

In certain embodiments, each positive vertical power distribution bar component 426 includes a positive vertical power distribution bar component top portion, a positive vertical power distribution bar component bottom portion, a positive vertical power distribution bar component middle portion, or a combination thereof. In certain embodiments, the positive vertical power distribution bar component middle portion is physically coupled between the positive vertical power distribution bar component top portion and the positive vertical power distribution bar component bottom portion. In certain embodiments, the positive vertical power distribution bar component middle portion is electrically coupled to the positive vertical power distribution bar component top portion and the positive vertical power distribution bar component bottom portion. In certain embodiments, the positive vertical power distribution bar component top portion, the positive vertical power distribution bar component bottom portion and the positive vertical power distribution bar component middle portion are constructed from a single piece of material. In certain embodiments, the positive vertical power distribution bar component top portion, the positive vertical power distribution bar component bottom portion and the positive vertical power distribution bar component middle portion are constructed form a single piece of electrically conductive material.

In certain embodiments, each ground vertical power distribution bar component 426 includes a ground vertical power distribution bar component top portion, a ground vertical power distribution bar component bottom portion, a ground vertical power distribution bar component middle portion, or a combination thereof. In certain embodiments, the ground vertical power distribution bar component middle portion is physically coupled between the ground vertical power distribution bar component top portion and the ground vertical power distribution bar component bottom portion. In certain embodiments, the ground vertical power distribution bar component middle portion is electrically coupled to the ground vertical power distribution bar component top portion and the ground vertical power distribution bar component bottom portion. In certain embodiments, the ground vertical power distribution bar component top portion, the ground vertical power distribution bar component bottom portion and the ground vertical power distribution bar component middle portion are constructed from a single piece of material. In certain embodiments, the ground vertical power distribution bar component top portion, the ground vertical power distribution bar component bottom portion and the ground vertical power distribution bar component middle portion are constructed form a single piece of electrically conductive material.

In certain embodiments, the interlaced vertical power distribution bar components 426 include first side interlaced vertical power distribution bar components, second side interlaced vertical power distribution bar components, or a combination thereof. In certain embodiments, the first side interlaced vertical power distribution bar components are positioned close to a first side edge of the power system 400. In certain embodiments, the second side interlaced vertical power distribution bar components are positioned close to a second side edge of the power system 400. In certain embodiments, the power distribution bars 424 extend between the first side edge of the power system and the second side edge of the power system.

In certain embodiments, the power distribution system extraction mechanism 416 includes a horizontal extraction portion and the vertical extraction portions. In certain embodiments, the horizontal extraction portion and the vertical extraction portions provide a power distribution system support brace. In certain embodiments, one or both vertical extraction portions include a respective extraction manipulation component. In certain embodiments, each extraction manipulation component is coupled to a wall component of a vertical extraction portion. In certain embodiments, each vertical extraction portion is mounted to the system circuit board 414. In certain embodiments, each vertical extraction portion is mounted to respective system circuit board mounting elements 420 of the system circuit board 414.

In certain embodiments, the power distribution system extraction mechanism 416 is positioned within the power distribution system 412. In certain embodiments, the horizontal extraction portion is positioned underneath the power distribution system 412. In certain embodiments, each vertical extraction portion is positioned inside a respective vertical power distribution bar component.

In certain embodiments, the power supply unit installation system 418 enforces bottom to top power supply unit population requirements associated with a component region of an information handling system. In certain embodiments, the power supply unit installation system 418 includes a power supply unit bay lock-out mechanism. In certain embodiments, the power supply unit bay lock-out mechanism includes a mechanical lock-out feature. In certain embodiments, the power supply unit bay lock-out mechanism enforces a bottom to top power supply unit population requirement associated with a component region of an information handling system. In certain embodiments, the power supply unit bay lock-out mechanism blocks one or more upper power supply unit bays until a power supply unit is installed in a bottom power supply unit bay. In certain embodiments, the power supply unit bay lock-out mechanism is controlled by gravity, is spring-loaded, or a combination thereof. In certain embodiments, the bottom power supply unit bay is associated with a baseboard power supply unit connection. In certain embodiments, the one or more upper power supply unit bays are associated with respective power distribution system power supply unit connections.

In certain embodiments, the power supply unit installation system 418 includes a first side power supply unit bay lock-out mechanism, a second side power supply unit lock-out mechanism, or a combination thereof. In certain embodiments, the first side power supply unit bay lock-out mechanism and second side power supply unit lock-out mechanism are configured to interoperate such that the first side power supply unit bay lock-out mechanism and the second side power supply unit bay lock-out mechanism enforce a bottom to top power supply unit population requirement associated with both the first side power supply unit population and second side power supply unit population.

Figure 5:
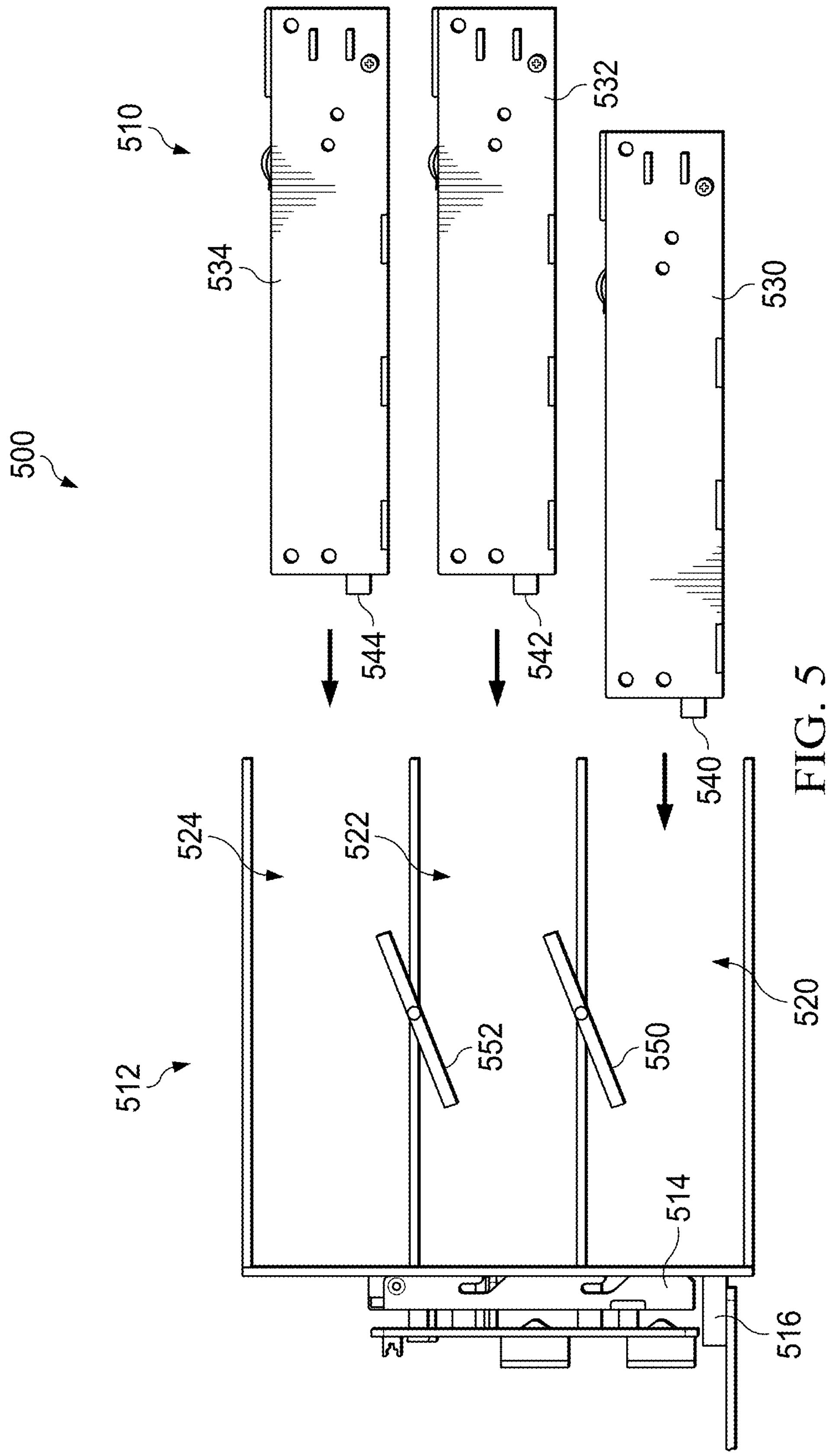
FIG. 5 shows a diagrammatic side view of a power supply unit installation system.

FIG. 5 shows a diagrammatic side view of a power supply unit installation system environment 500. In certain embodiments, the power supply unit installation system environment 500 corresponds to some or all of power environment 360.

In certain embodiments, the power supply unit installation system environment 500 includes one or more power supply units 510, a power supply unit installation system 512, a power supply board 514, a system circuit board 516, or a combination thereof. In certain embodiments, the system circuit board 516 includes one or more of a motherboard, a planar circuit board, a high performance module circuit board, and a baseboard circuit board. In certain embodiments, the power supply board 514 includes one or more power supply connectors. In certain embodiments, the system circuit board 516 includes a power supply connector.

In certain embodiments, the power supply unit installation system 512 includes one or more power supply bays 520, 522, 524. In certain embodiments, power supply bay 520 corresponds to a lower power supply bay. In certain embodiments, power supply bays 522, 524 correspond to respective upper power supply bays. In certain embodiments, the one or more power supply units 510 include power supply units 530, 532, 534. In certain embodiments, power supply unit 530 corresponds to a lower power supply unit. In certain embodiments, power supply units 532, 534 correspond to respective upper power supply units. In certain embodiments, power supply units 530, 532, 534 fit within respective power supply bays 520, 524, 526. In certain embodiments, lower power supply unit 530 fits within lower power supply bay 520. In certain embodiments, upper power supply unit 532 fits within upper power supply bay 522. In certain embodiments, upper power supply unit 534 fits within upper power supply bay 524.

In certain embodiments, power supply units 530, 532, 534 include respective power supply unit connectors 540, 542, 544. In certain embodiments, power supply unit connector 540 corresponds to a lower power supply unit connector. In certain embodiments, power supply unit connectors 542, 544 correspond to respective upper power supply unit connectors. In certain embodiments, lower power supply unit connector 540 mates with a power supply unit connector mounted on the system circuit board 516. In certain embodiments, upper power supply unit connector 532 mates with a power supply connector mounted on the power supply board 514. In certain embodiments, upper power supply unit connector 534 mates with a power supply connector mounted on the power supply board 514. In certain embodiments, the power supply connector mounted on the system circuit board 516 provides power to the system circuit board 516 when the lower power supply unit 530 is connected to the power supply connector mounted on the power supply board 514. In certain embodiments, the power supply connectors mounted on the power supply board 514 provide power to a power distribution system.

In certain embodiments, the power supply unit installation system 512 enforces bottom to top power supply unit population requirements associated with a component region of an information handling system. In certain embodiments, the power supply unit installation system 512 includes a power supply unit bay lock-out mechanism. In certain embodiments, the power supply unit bay lock-out mechanism includes a lower bay lock-out mechanism 550, an upper bay lock-out mechanism 552, or a combination thereof.

In certain embodiments, the lower bay lock-out mechanism 550 includes a lower bay mechanical lock-out feature. In certain embodiments, the upper bay lock-out mechanism 552, includes an upper bay mechanical lock-out feature. In certain embodiments, the power supply unit bay lock-out mechanism enforces a bottom to top power supply unit population requirement associated with a component region of an information handling system. In certain embodiments, the lower power supply unit bay lock-out mechanism blocks one or more upper power supply unit bays until a power supply unit is installed in a lower power supply unit bay. In certain embodiments, the upper power supply unit bay lock-out mechanism blocks one or more upper power supply unit bays until a power supply unit is installed in a lower upper power supply unit bay. For example, the upper bay lock-out mechanism 552 blocks power supply unit bay 524 until a power supply unit is installed in power supply unit bay 522. In certain embodiments, the lower power supply unit bay lock-out mechanism 550, the upper power supply unit lock-out mechanism 552, or a combination thereof, are controlled by gravity, is spring-loaded, or a combination thereof. In certain embodiments, the bottom power supply unit bay is associated with a baseboard power supply unit connection. In certain embodiments, the one or more upper power supply unit bays are associated with respective power distribution system power supply unit connections.

Other embodiments are within the following claims. For example, the power supply unit bay lock-out mechanism could be configured to enforce one or more power supply unit population requirements associated with an information handling system. These power supply unit population requirements could include the disclosed bottom to top power supply unit population requirements as well as top to bottom power supply unit population requirements, left to right power supply unit population requirements, right to left power supply unit population requirements, or a combination thereof.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A power supply unit installation system of a power system for use with an information handling system, comprising:

a plurality of power supply unit bays; and a power supply unit bay lock-out mechanism, the power supply unit bay lock-out mechanism enforcing power supply unit population requirements associated with the information handling system; and wherein the plurality of power supply unit bays include a lower power supply unit bay and an upper power supply unit bay; and, the power supply unit bay lock-out mechanism prevents installation of a power supply unit in the upper power supply unit bay until a power supply unit is installed in the lower power supply unit bay.

2. The power supply unit installation system of claim 1, wherein:

the power supply unit population requirements include bottom to top power supply unit population requirements; and the bottom to top power supply unit population requirements are associated with a component region of the information handling system.

3. The power supply unit installation system of claim 1, wherein:

the lower power supply unit bay is positioned such that a power supply unit installed within the lower power supply unit bay powers a system board; and, the upper power supply unit bay is positioned such that a power supply unit installed within the upper power supply unit bay powers a power distribution system.

4. The power supply unit installation system of claim 1, wherein:

the power supply unit bay lock-out mechanism includes a lower bay lock-out mechanism, the lower power supply unit bay lock-out mechanism blocking an upper power supply unit bay until a power supply unit is installed in a lower power supply unit bay.

5. The power supply unit installation system of claim 4, wherein:

the power supply unit bay lock-out mechanism includes an upper bay lock-out mechanism, lower power supply unit bay lock-out mechanism blocking an upper power supply unit bay until a power supply unit is installed in a lower upper power supply unit bay.

6. A power system for an information handling system comprising:

a plurality of power supply units; and, a power distribution system coupled to the plurality of power supply units; and, a power supply unit installation system, the power supply unit installation system comprising a plurality of power supply unit bays; and a power supply unit bay lock-out mechanism, the power supply unit bay lock-out mechanism enforcing power supply unit population requirements associated with the information handling system; and wherein the plurality of power supply unit bays include a lower power supply unit bay and an upper power supply unit bay; and, the power supply unit bay lock-out mechanism prevents installation of a power supply unit in the upper power supply unit bay until a power supply unit is installed in the lower power supply unit bay.

7. The power system of claim 6, wherein:

the power supply unit population requirements include bottom to top power supply unit population requirements; and the bottom to top power supply unit population requirements are associated with a component region of the information handling system.

8. The power system of claim 6, wherein:

the lower power supply unit bay is positioned such that a power supply unit installed within the lower power supply unit bay powers a system board; and, the upper power supply unit bay is positioned such that a power supply unit installed within the upper power supply unit bay powers a power distribution system.

9. The power system of claim 6, wherein:

the power supply unit bay lock-out mechanism includes a lower bay lock-out mechanism, the lower power supply unit bay lock-out mechanism blocking an upper power supply unit bay until a power supply unit is installed in a lower power supply unit bay.

10. The power system of claim 9, wherein:

the power supply unit bay lock-out mechanism includes an upper bay lock-out mechanism, lower power supply unit bay lock-out mechanism blocking an upper power supply unit bay until a power supply unit is installed in a lower upper power supply unit bay.

11. A system comprising:

a chassis;

a plurality of components contained within the chassis; and, a power system providing power to the plurality of components, the power system including a power supply unit, a power distribution system coupled to the power supply unit and a power supply unit installation system, the power supply unit installation system comprising a plurality of power supply unit bays; and a power supply unit bay lock-out mechanism, the power supply unit bay lock-out mechanism enforcing power supply unit population requirements associated with the information handling system; and wherein the plurality of power supply unit bays include a lower power supply unit bay and an upper power supply unit bay; and, the power supply unit bay lock-out mechanism prevents installation of a power supply unit in the upper power supply unit bay until a power supply unit is installed in the lower power supply unit bay.

12. The system of claim 11, wherein:

the power supply unit population requirements include bottom to top power supply unit population requirements; and the bottom to top power supply unit population requirements are associated with a component region of the information handling system.

13. The system of claim 11, wherein:

the lower power supply unit bay is positioned such that a power supply unit installed within the lower power supply unit bay powers a system board; and, the upper power supply unit bay is positioned such that a power supply unit installed within the upper power supply unit bay powers a power distribution system.

14. The system of claim 11, wherein:

the power supply unit bay lock-out mechanism includes a lower bay lock-out mechanism, the lower power supply unit bay lock-out mechanism blocking an upper power supply unit bay until a power supply unit is installed in a lower power supply unit bay.

15. The system of claim 14, wherein:

the power supply unit bay lock-out mechanism includes an upper bay lock-out mechanism, lower power supply unit bay lock-out mechanism blocking an upper power supply unit bay until a power supply unit is installed in a lower upper power supply unit bay.

* * * * *